(12) United States Patent
Murai et al.

(10) Patent No.: US 8,765,003 B2
(45) Date of Patent: Jul. 1, 2014

(54) NANOCOMPOSITE THERMOELECTRIC CONVERSION MATERIAL AND PROCESS FOR PRODUCING SAME

(75) Inventors: Junya Murai, Susono (JP); Takuji Kita, Numazu (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 124 days.

(21) Appl. No.: 13/521,797

(22) PCT Filed: Jan. 18, 2011

(86) PCT No.: PCT/IB2011/000068
§ 371 (c)(1),
(2), (4) Date: Jul. 12, 2012

(87) PCT Pub. No.: WO2011/086464
PCT Pub. Date: Jul. 21, 2011

(65) Prior Publication Data
US 2012/0292575 A1    Nov. 22, 2012

(30) Foreign Application Priority Data
Jan. 18, 2010    (JP) .................... 2010-008299

(51) Int. Cl.
*H01L 35/26* (2006.01)
(52) U.S. Cl.
USPC .................................... 252/62.3 T
(58) Field of Classification Search
USPC .................................... 252/62.3 T
See application file for complete search history.

(56) References Cited

U.S. PATENT DOCUMENTS 8,217,255 B2 *   7/2012   Murai et al. ............. 136/201
8,394,284 B2 *   3/2013   Murai et al. ............. 252/62.3 T

FOREIGN PATENT DOCUMENTS

| EP | 1959508 A1 | 8/2008 |
|---|---|---|
| JP | 09-074229 A | 3/1997 |
| JP | 2000-261044 A | 9/2000 |
| JP | 2004-063768 A | 2/2004 |
| JP | 2008-305907 A | 12/2008 |
| JP | 2008-305919 A | 12/2008 |
| JP | 4286053 B | 4/2009 |
| JP | 2009-141127 A | 6/2009 |
| JP | 2009-147145 A | 7/2009 |
| JP | 2010-114419 A | 5/2010 |
| WO | 2007/066820 A1 | 6/2007 |

OTHER PUBLICATIONS

International Search Report and Written Opinion for corresponding International Patent Application No. PCT/IB2011/000068 mailed Oct. 13, 2011.

(Continued)

*Primary Examiner* — Carol M Koslow
(74) *Attorney, Agent, or Firm* — Sughrue Mion, PLLC (57) ABSTRACT

The invention provides a nanocomposite thermoelectric conversion material (1) in which the matrix has a polycrystalline structure, and crystal grains (10) and a crystal grain boundary phase (12) of a different composition are present therein, and in which the same type of phonon-scattering particles (14) are dispersed within the crystal grains (10) and the crystal grain boundary phase (12).

5 Claims, 8 Drawing Sheets

(56) References Cited

OTHER PUBLICATIONS

Xiong Z et al: "Effects of nano-$TiO_2$ dispersion on the thermoelectric properties of filled-skutterudite $Ba_{0.22}Co_4Sb_{12}$", Solid State Sciences, Elsevier, Paris, FR, vol. 11, No. 9, Sep. 1, 2009, pp. 1612-1616, XP026519769, ISSN: 1293-2558, DOI: 10.1016/J.SOLIDSTATESCIENCES.2009.06.007.

Mi J L et al: "Thermoelectric properties of $Yb_{0.15}Co_4Sb_{12}$ based nanocomposites with $CoSb_3$ nano-inclusion", Journal of Physics D. Applied Physics, IOP Publishing, Bristol, GB, vol. 41, No. 20, Oct. 21, 2008, p. 205403, XP020140948, ISSN: 0022-3727, DOI: 10.1088/0022-3727/41/20/205403.

Medlin D L et al: "Interfaces in bulk thermoelectric materials", Current Opinion in Colloid and Interface Science, London, GB, vol. 14, No. 4, Aug. 1, 2009, pp. 226-235, XP026251188, ISSN: 1359-0294, DOI: 10.1016/J.COCIS.2009.05.001.

Brochin F et al: "Preparation and transport properties of polycrystalline Bi and $Bi-SiO_2$ nanocomposites", Journal of Applied Physics, American Institute of Physics, New York, US, vol. 88, No. 6, Sep. 15, 2000, pp. 3269-3275, XP012051572, ISSN: 0021-8979, DOI: 10.1063/1.1289079.

Japanese Office Action for corresponding JP Patent Application No. 2010-008299 issued on Oct. 28, 2011.

Office Action issued Apr. 19, 2013 in corresponding U.S. Appl. No. 13/122,575.

\* cited by examiner

NANOCOMPOSITE THERMOELECTRIC CONVERSION MATERIAL AND PROCESS FOR PRODUCING SAME

BACKGROUND OF THE INVENTION

1. Field of the Invention

The invention relates to a nanocomposite thermoelectric conversion material in which nanosized particles for phonon scattering are dispersed in the matrix of a thermoelectric conversion material, and a process for producing the same.

2. Description of the Related Art

A thermoelectric conversion material is an energy material that directly converts thermal energy to electrical energy based on two basic thermoelectric effects, the Seebeck effect and the Peltier effect.

Compared with conventional electric power generating technology, a thermoelectric generating device using a thermoelectric conversion material has many advantages. For example, it has a simple structure, has a high durability, has no movable component, is easy to micronize, is highly reliable and maintenance free, has a long life, does not generate acoustic noise, does not pollute the environment, and utilizes low temperature waste heat.

Compared with conventional compression type cooling technology, a thermoelectric cooling device using a thermoelectric conversion material has advantages. For example, it does not require fluorocarbons and therefore does not pollute the environment, is easy to miniaturize, has no movable component, and does not generate acoustic noise.

Therefore, in response to the increasing severity of energy and environmental problems over recent years in particular, the practical use of thermoelectric conversion materials is expected in a wide range of applications in fields such as aerospace, national defense buildup, observation of geological and meteorological phenomena, medical services and hygiene, and microelectronics, as well as in utilization of waste heat in petroleum processing, metallurgy, and the electric power industry.

The power factor $P=S^2\sigma$ and the dimensionless thermoelectric figure of merit $ZT=(S^2\sigma/\kappa)T$, where S is the Seebeck coefficient, $\sigma$ is electrical conductivity, $\kappa$ is thermal conductivity, and T is absolute temperature, are used as indications for evaluating the performance of thermoelectric conversion materials. In other words, to obtain high thermoelectric properties the Seebeck coefficient S and the electrical conductivity $\sigma$ need to be high, and the thermal conductivity $\kappa$ needs to be low.

Phonon scattering, which are carriers of thermal conduction, is effective in decreasing thermal conductivity $\kappa$, and a composite thermoelectric conversion material in which particles for phonon scattering are dispersed in a thermoelectric conversion material matrix has been advocated as a thermoelectric conversion material.

Japanese Patent No. 4286053 discloses a technology, which segregate a Te rich phase, that includes excess concentration of Te compared to stoichiometric composition, at the grain boundaries or within the grains of a BiTe type thermoelectric semiconductor. Then the thermal conductivity is lowered due to distortion of the crystal lattice caused by the Te rich phase.

However, because the segregated Te rich phase is on a micron-order, the decrease in the thermal conductivity is very small, and the thermoelectric conversion performance is not greatly increased. In this technology, synthesis is carried out using molten metals, and further reduction in grain size cannot be achieved.

WO 2007/066820 (A1) describes a technology for dispersing nanosized phonon-scattering particles in the matrix of a thermoelectric conversion material at intervals not larger than the mean free path of phonons and not smaller than the mean free path of the carrier. This document also describes technology for reducing the slurry by mixing the thermoelectric material precursor solution into a ceramic powder dispersed pH-adjusting liquid.

Japanese Patent Application Publication No. 2008-305907 (JP-A-2008-305907) describes technology for dispersing ceramic particles as nanosized phonon-scattering particles in the matrix of a thermoelectric conversion material.

Japanese Patent Application Publication No. 2008-305919 (JP-A-2008-305919) describes technology for dispersing metal particles as nanosized phonon-scattering particles in the matrix of a thermoelectric conversion material.

By reducing the phonon-scattering particles to nanosized particles, the technologies described in WO 2007/066820 (A1), JP-A-2008-305907, and JP-A-2008-305919 can decrease the thermal conductivity and greatly increase thermoelectric conversion performance over technologies utilizing micron-sized particles.

SUMMARY OF THE INVENTION

The invention provides a nanosized composite thermoelectric conversion material in which the thermal conductivity decreasing effect brought about by nanosized phonon-scattering particles is increased even more, and thermoelectric conversion performance is considerably improved thereby.

A first aspect of the invention relates to a nanocomposite thermoelectric conversion material wherein nanosized phonon-scattering particles are dispersed in the matrix of a thermoelectric conversion material. The matrix has a polycrystalline structure, crystal grains constituting the polycrystalline structure and a crystal grain boundary phase compositionally different from the crystals are present in the matrix, and the same types of phonon-scattering particles are dispersed within the above crystal grains and crystal grain boundary phase.

In this aspect, the phonon-scattering particles once in the form of dispersion in a starting solution are dispersed within the crystal grains and the crystal grain boundary phase.

In this aspect, the diameter of each of the crystal grains can be 100 nm or smaller.

In this aspect, the diameter of each of the phonon-scattering particles dispersed within the crystal grains can be 1 to 10 nm, and the diameter of each of the phonon-scattering particles dispersed in the crystal grain boundary phase can be 1 to 10 nm.

In this aspect, the phonon-scattering particles dispersed within the crystal grains and the phonon-scattering particles dispersed in the crystal grain boundary phase can have the same diameter.

In this aspect, the phonon-scattering particles 14 can be $SiO_2$ powder.

According to this aspect, the phonon-scattering effect of the nanocomposite thermoelectric conversion material is greatly increased by dispersing the phonon-scattering particles not only within the crystal grains of the polycrystalline thermoelectric conversion material matrix, but also in the crystal grain boundary phase thereof. As a result, the thermal conductivity is greatly reduced, and an extremely high thermoelectric conversion capacity is obtained thereby.

A second aspect of the invention relates to a process for producing a nanocomposite thermoelectric conversion material in which nanosized phonon-scattering particles are dispersed in the matrix of a thermoelectric conversion material. The process for producing the nanocomposite thermoelectric conversion material includes:

a first step of preparing a starting solution by dissolving a salt each constituent element of the thermoelectric conversion material and dispersing phonon-scattering particles therein;

a second step of dripping a reducing agent into the starting solution to precipitate each constituent element of the thermoelectric conversion material onto surfaces of the phonon-scattering particles and form a slurry;

a third step of performing a hydrothermal treatment on the slurry and forming a composite in which the phonon-scattering particles are dispersed in a matrix precursor having a high-melting point alloy phase with a relatively high melting point and a low-melting point alloy phase with a low melting point;

a fourth step of sintering the composite and forming a sintered body in which the phonon-scattering particles are dispersed in a polycrystalline matrix; and a fifth step of selectively melting only the low-melting point alloy phase in crystal grain boundaries of the sintered body by performing a heat treatment on the sintered body, and incorporating nearby phonon-scattering particles (14) into the resulting low-melting point molten phase, and thereby forming a boundary phase as a composite in which the phonon-scattering particles are dispersed in the low-melting point alloy phase.

In this aspect, in the first step at least one type of constituent element in the thermoelectric conversion material can be dissolved in the starting solution in an excess amount with relation to the solid solubility limit thereof at room temperature; in the third step the access amount of constituent element can be precipitated in the matrix precursor and dispersed as second type phonon-scattering particles; and in the fifth step the grain boundary phase can be formed by dispersing the second type phonon-scattering particles together with the phonon-scattering particles.

In this aspect, the diameter of each of the crystal grains can be 100 nm or less.

In this aspect, the diameter of each of the phonon-scattering particles dispersed within the crystal grains can be 1 to 10 nm, and the diameter of each of the phonon-scattering particles dispersed in the crystal grain boundary phase can be 1 to 10 nm.

In this aspect, the phonon-scattering particles dispersed within the crystal grains and the phonon-scattering particles dispersed in the crystal grain boundary phase can have the same diameter.

In this aspect, the phonon-scattering particles 14 can be $SiO_2$ powder.

According to this aspect, in the process for producing the nanocomposite thermoelectric conversion material, at the crystal grain boundaries of the sintered body having a polycrystalline matrix wherein a relatively high-melting point phase and low-melting point phase coexist, when only the low-temperature phase is melted, the surrounding phonon-scattering particles are incorporated into the molten phase formed at the crystal grain boundaries, and as a result, phonon-scattering particles can be dispersed not only within the crystals of the thermoelectric conversion material, but also in the crystal grain boundaries, thereby realizing a high thermoelectric conversion capacity.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF THE EMBODIMENTS

The structure of the nanocomposite thermoelectric conversion material in embodiments of the invention will be explained with reference to FIGS. 1A and 1B.

Figure 1A:
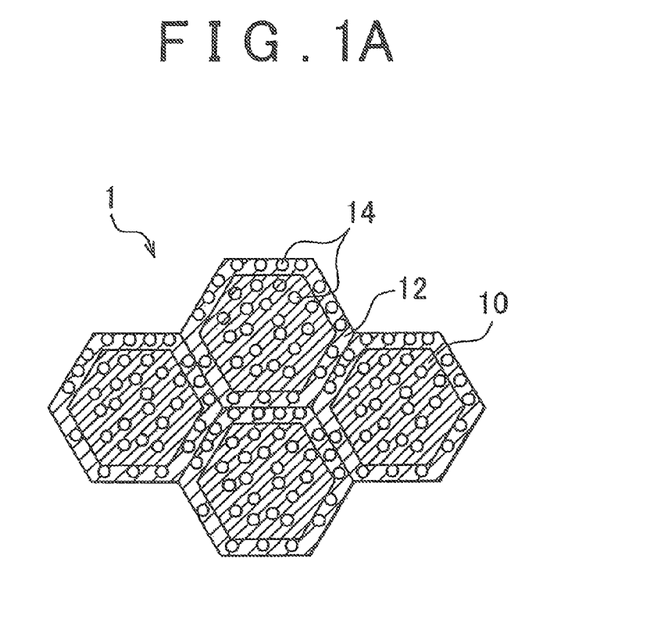
FIGS. 1A and 1D are schematic diagrams showing the microstructure of the nanocomposite thermoelectric conversion material of the invention.
Figure 1B:
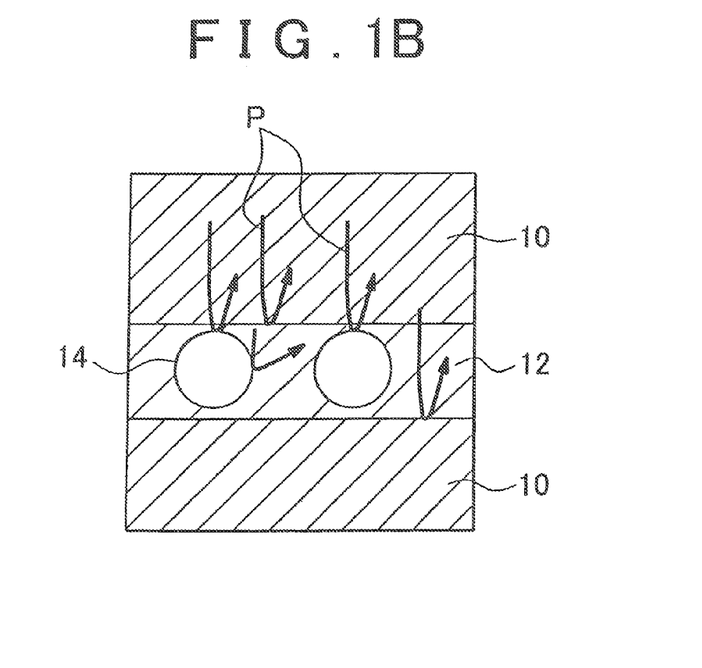

As shown schematically in FIG. 1A, the nanocomposite thermoelectric conversion material 1 of the embodiments of the invention is polycrystalline, and phonon-scattering particles 14 are dispersed in a matrix consisting of crystal grains 10 and a crystal grain boundary phase 12. The phonon-scattering particles 14 scatter phonons within the crystal grains 10 and the crystal grain boundary 12. FIG. 1B schematically shows a further enlargement of the crystal boundary vicinity. The phonons P are scattered by the phonon-scattering particles 14 in the grain boundary phase 12 and are also scattered at the interface surface between the crystal grains 10 and the grain boundary phase 12. In other words, in a related art nanocomposite thermoelectric conversion material without a crystal grain boundary phase, the phonons were only scattered by phonon-scattering particles within the grains, but in the nanocomposite thermoelectric conversion material according to the embodiments of the invention, they are also scattered by the phonon scattering particles in the grain boundary phase and the crystal grain-crystal boundary phase interface, thus encountering a scattering effect in triplicate.

The same type of phonon-scattering particles are dispersed in the crystal grains and in the crystal grain boundary phase of the polycrystalline thermoelectric conversion material matrix of the nanocomposite thermoelectric conversion material according to the embodiments of the invention.

In a first embodiment of the invention, the phonon-scattering particles that had been dispersed in the starting solution are dispersed within the crystal grains and the crystal grain boundary phase.

In a second embodiment of the invention, at least one type of constitutive element of the thermoelectric conversion material constituting the matrix is dissolved in the initial solution to supersaturation, then the element is precipitated in a hydrothermal treatment, and the element is used as an additional second phonon-scattering particle, which is than dispersed within the crystal grains and crystal grain boundary phase in the same manner as the first embodiment. The phonon-scattering effect is increased thereby. In this second embodiment, the phonon-scattering particles described in the first embodiment and the second phonon-scattering particles are spaced several nanometers apart in the grain boundary phase, and therefore they &lotion as a very rough interface, thereby increases the phonon-scattering effect even more.

In the nanocomposite thermoelectric conversion material according to the embodiments of the invention, the crystal diameter in the matrix can be nanosized to 100 nm or smaller.

The crystal grain boundary phase must be an electrical conductive phase to guarantee the electrical conductivity of the nanocomposite thermoelectrical conversion material.

The crystal grain boundary phase must be sufficiently thin in relation to the crystal grain diameter. Typically, a crystal grain boundary phase thickness can be about 1 to 10 nm in relation to a crystal grain diameter of 100 nm or smaller.

The phonon-scattering particles dispersed within the crystal grains can be about 1 to 100 nm, and the phonon-scattering particles dispersed In the crystal grain boundary phase can be about 1 to 10 nm.

The system of the composition used for the nanocomposite thermoelectric conversion material according to the embodiments of the invention is not necessarily limited herein, but examples of systems include the $(Bi,Sb)_2(Te,Se)_3$ system, $CoSb_3$ system, PbTe system, SiGe system; $MgSi$, system and the like. A half-Heusler alloy such as a TiNiSn system or ZrNiSn system can also be used in the nanocomposite thermoelectric conversion material of the invention.

A nanocomposite thermoelectric conversion material in which $SiO_2$ is dispersed as the first phonon-scattering particles and $Sb_2O_3$ is dispersed as the second phonon-scattering particles in a matrix of a $(Bi,Sb)_2Te_3$ thermoelectric conversion material was prepared by the production process used in the embodiments of the invention. The conditions and procedures are described below.

Figure 2:
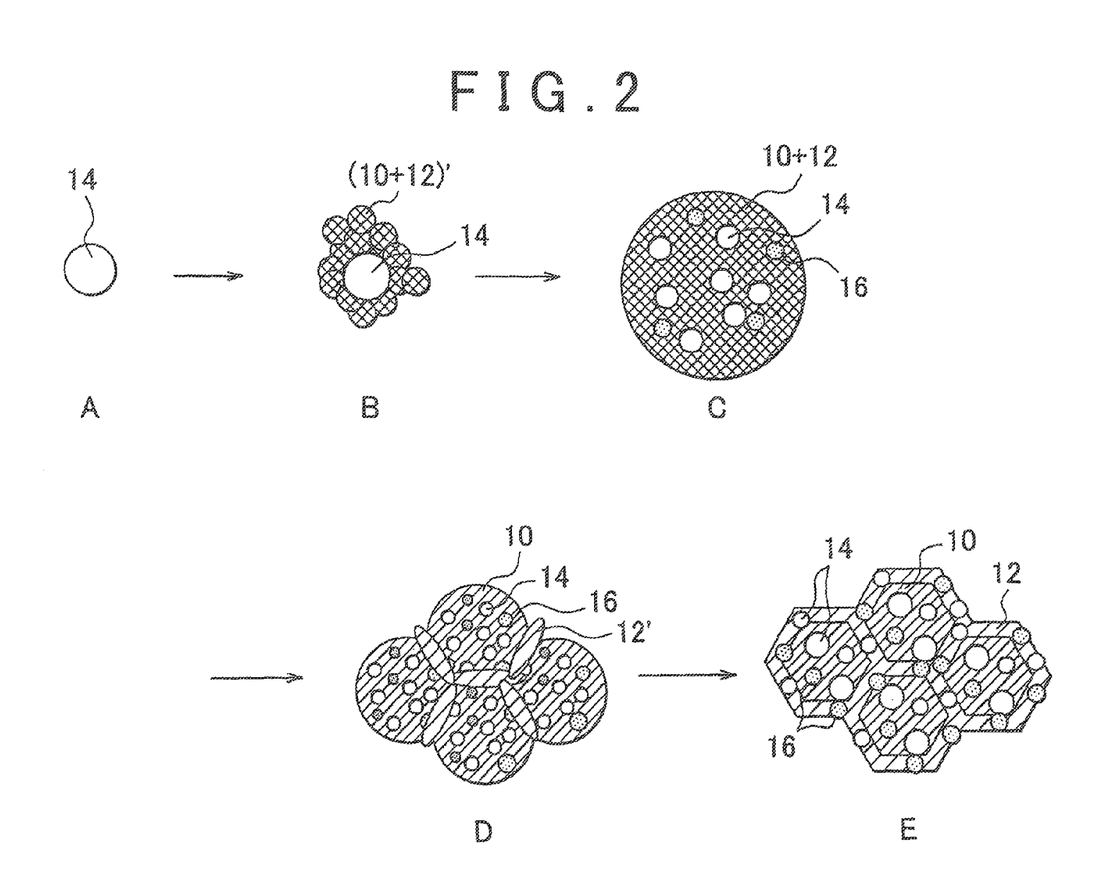
FIG. 2 is a schematic diagram showing the configuration of the structure at each stage of the chemical synthesis process of the nanocomposite thermoelectric conversion material of the invention.

FIG. 2 schematically shows the sequence of transition in internal structure accompanying the production steps.

Figure 3:
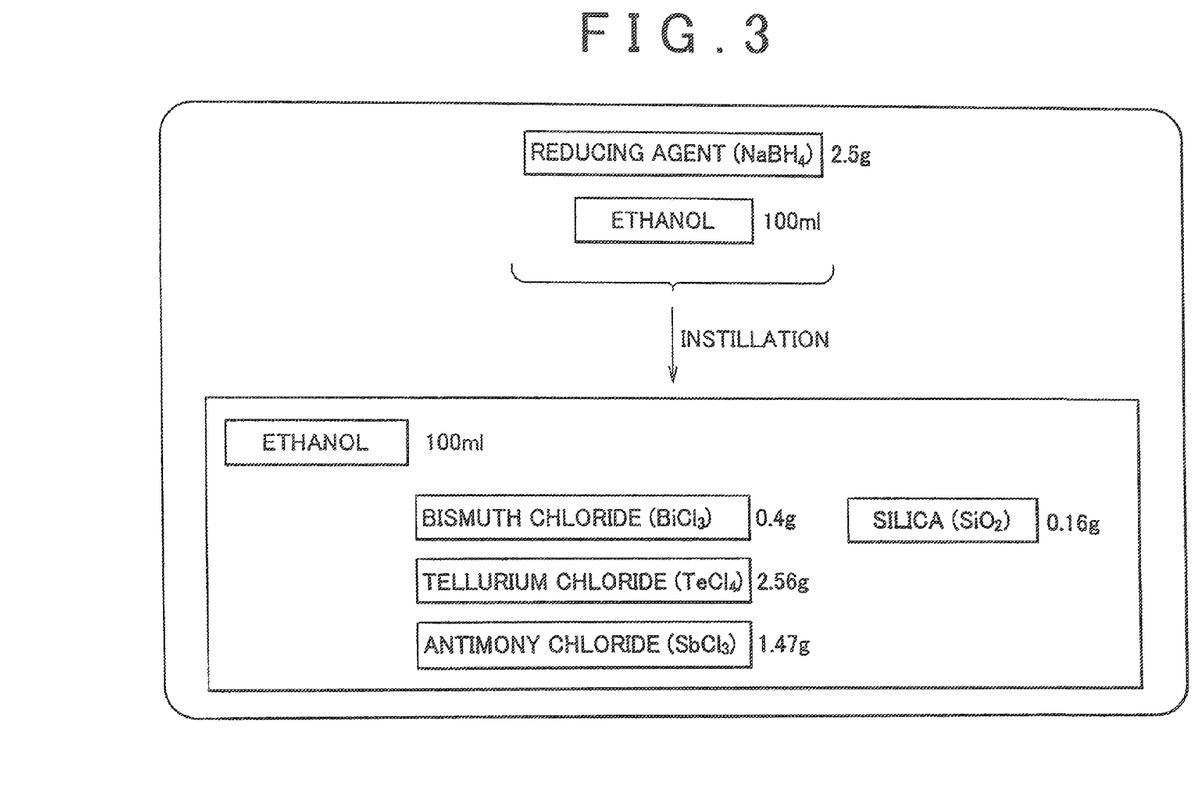
FIG. 3 is a flow chart showing the composition of the starting solution and reducing treatment for preparing the nanocomposite thermoelectric conversion material according to the embodiments of the invention.

FIG. 3 shows the starting solution preparation process (first step) and the reducing process (second step).

In the first step, as salts of the constituent elements Bi, Te, and Sb of the thermoelectric conversion material, 0.4 g of bismuth chloride ($BiCl_3$), 2.56 g of tellurium chloride ($TeCl_4$), and 1.47 g of antimony chloride ($SbCl_3$) were dissolved in 100 mL of ethanol to prepare an ethanol solution, and $SiO_2$ powder 14 (average particle size: 5 nm) was dispersed therein as the phonon-scattering particles to obtain a starting solution (A in FIG. 2). In this case an excessive amount of antimony chloride was added to reach super saturation in Sb at room temperature in relation to the $(Bi,Sb)_2Te_3$ thermoelectric conversion material matrix.

In the second step a reducing agent prepared by dissolving 2.5 g of $NaBH_4$ in 100 mL of ethanol was instilled into the above-described starting solution. As a result, an ethanol slurry was formed wherein each of the constituent elements of the thermoelectric conversion material Be,Te,Sb(10+12)' was deposited on the surface of the $SiO_2$ particles 14 (B in FIG. 2). This slurry was filtered with a mixture of 500 mL of water and 300 mL of ethanol, and then further filter-washed with 300 mL of ethanol.

In the third step (C in FIG. 2), a hydrothermal treatment was performed in a sealed autoclave at 240° C. for 24 hours. The constituent elements of the thermoelectric conversion material (10+12)' were mutually diffused and alloyed thereby. However, because the time period was shorter than in the conditions for complete alloying, a matrix precursor (10+12) consisting of a mixture of a relatively high-melting point alloy phase and a low-melting point alloy phase was formed thereby. In the embodiments, the high-melting point alloy phase was a Sb-rich phase such as $Sb_2Te_3$ or $(Bi,Sb)_2Te_3$, and the low-melting point alloy phase was a Bi-rich phase such as $Bi_2Te_3$ or $(Bi,Sb)_2Te_3$. The $SiO_2$ phonon-scattering particles 14 dispersed in the starting solution were dispersed throughout the matrix precursor (10+12) as the first phonon-scattering particles. Moreover, the Sb that had been dissolved in excess in the starting solution precipitated, was oxidized to $Sb_2O_3$ in the hydrothermal treatment, and dispersed as the second phonon-scattering particles 16. The product was dried under a nitrogen gas flow atmosphere and recovered as a powder. The yield was approximately 2.1 g of powder.

In the fourth step the powder was spark plasma sintered (SPS) at 350° C. for 5 seconds to obtain a sintered body (C in FIG. 2).

In the fifth step the sintered body was annealed in a nitrogen atmosphere at 400° C. for 24 hours. As a result, only the low-melting point alloy phase (Bi-rich phase such as $Bi_2Te_3$ or $(Bi,Sb)_2Te_3$) was selectively melted in the crystal grain boundary as shown in D in FIG. 2. The annealing conditions were chosen so that only the low-melting point alloy phase would melt.

At that time, the $SiO_2$ as the first phonon-scattering particles 14 and the $Sb_2O_3$ as the second phonon-scattering particles that had been dispersed within the crystal grains were incorporated into the low-melting point molten layer 12' and dispersed in the grain boundary phase 12 consisting of the low-melting point alloy phase (E in FIG. 2).

Figure 4:
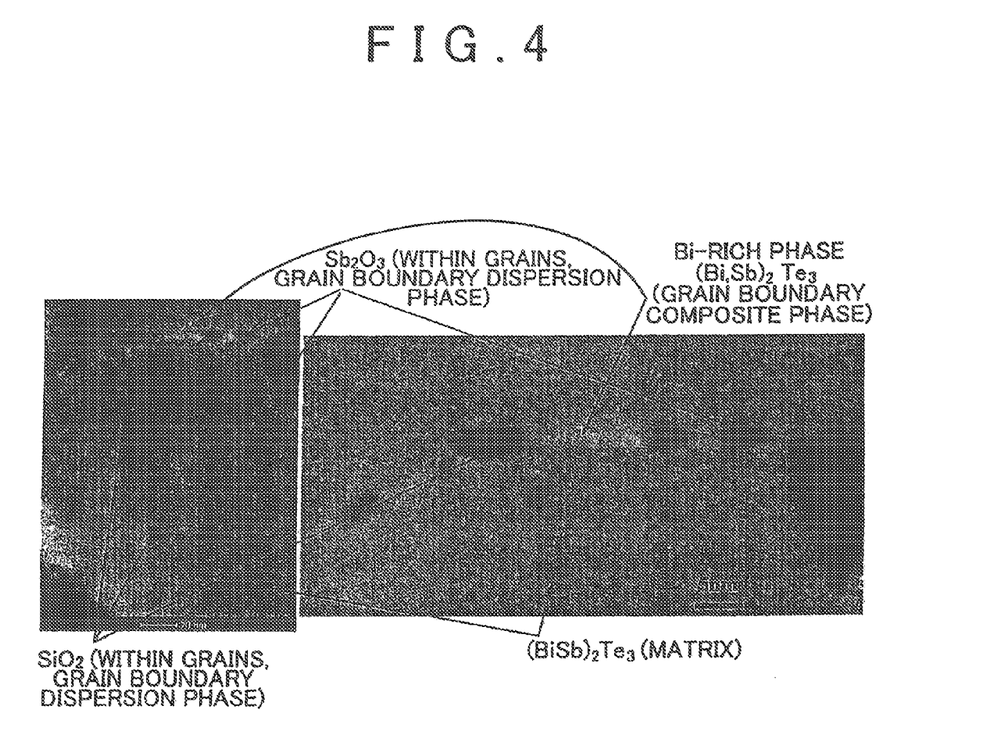
FIG. 4 is a transmission electron micrograph (TEM) of the nanocomposite thermoelectric conversion material according to the embodiments of the invention.

Thus, as shown in the TEM of FIG. 4, in accordance with the embodiments of the invention a nanocomposite thermoelectric conversion material was obtained in which $SiO_2$ as the first phonon-scattering particles and $Sb_2O_3$ as the second phonon-scattering particles are dispersed in the matrix of a $(Bi,Sb)_2Te_3$ thermoelectric conversion material.

At the crystal grain boundaries, the Bi-rich phase of $(Bi,Sb)_2Te_3$ can be seen as a grain boundary phase with a thickness of 1 to 10 nm. The Bi-rich phase of $(Bi,Sb)_2Te_3$ is electroconductive. $SiO_2$ particles and $Sb_2O_3$ particles with a diameter of 1 to 10 nm are present in this grain boundary phase. $SiO_2$ particles and $Sb_2O_3$ particles with a diameter of 1 to 100 nm are also present within the crystal grains. The average crystal grain size was 41 nm measured by the X-ray diffraction (XRD) Debye-Scherrer method.

First Comparative Example

The same conditions and procedures as in the embodiments were followed up through the fourth step of the embodiments except that hydrothermal treatment conditions in the third step were used at 240° C. and for 48 hours to produce uniform alloying. In the first step the amount of antimony chloride (SbCl3) was set at 1.24 g to provide a stoichiometric amount of Sb so that the $Sb_2O_3$ second phonon-scattering particles would not be produced in the third step. In other words, in the first comparative example, only SiO$_2$ particles were present as the phonon-scattering particles and no grain boundary phase 12 was formed, but in all other aspects the product was the same nanocomposite thermoelectric conversion material as in the embodiments.

Second Comparative Example

The conditions and procedures described below were used to produce a nanocomposite thermoelectric conversion material wherein SiO$_2$ and Sb$_2$O$_3$ were dispersed as phonon-scattering particles, but no grain boundary phase was formed. In other words, in the second comparative example, the product was the same nanocomposite thermoelectric conversion material as in the embodiments except no grain boundary phase was formed.

Figure 5:
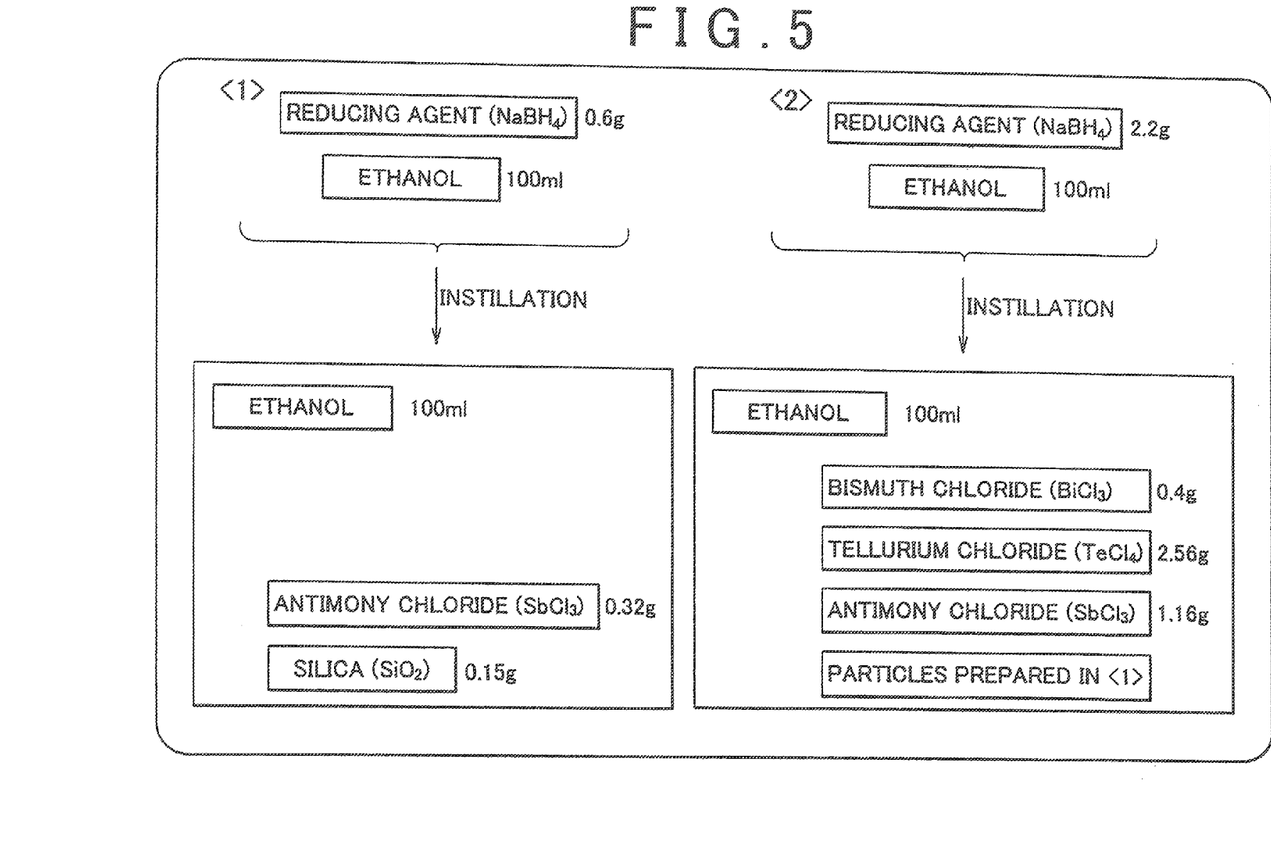
FIG. 5 is a flow chart showing the composition of the starting solution and reducing treatment for preparing Comparative Example 2, which does not have grain boundaries.

As shown in FIG. 5 <1>, formulation of the starting solution and the reduction treatment were performed to precipitate Sb on the surface of the SiO$_2$ particles and prepare SiO$_2$/Sb particles. At that time the amount of precipitation was adjusted to make an Sb layer of several nanometers in thickness.

Next, as shown in FIG. 5 <2>, a starting solution was prepared with a formulation where the SiO$_2$/Sb particles prepared in FIG. 5 <1> had been added, the reduction treatment was carried out thereon, Bi, Te, and Sb were precipitated on the surfaces of the SiO$_2$/Sb particles, and a slurry was formed. The resulting slurry was washed twice in the same manner as the embodiments.

Next, the same hydrothermal treatment as in the third step of the embodiments was performed. However, the treatment period was set at 48 hours, and the entire product was alloyed uniformly to produce a monophasic (Bi,Sb)$_2$Te$_3$ matrix precursor. The reaction product was dried under a nitrogen gas flow atmosphere and recovered as a powder. The yield was approximately 2.1 g of powder.

Next, SPS sintering was performed on the nanocomposite thermoelectric conversion material of Comparative Example 2 in the same manner as the fourth step of Embodiment S.

Example of Related Art

The properties of the thermoelectric conversion material disclosed in Journal of Crystal Growth Vol. 277 (2003), p. 258-263 was used for comparison as an example of related art. This example is a thermoelectric conversion material with a composition that is essentially the same as in the embodiments, but it does not use phonon-scattering particles. (*:)

Table 1 shows a summary of the structures of Embodiment S, Comparative Examples 1 and 2, and the related art example.

TABLE 1

| Composition | SiO$_2$ particles | Sb$_2$O$_3$ particles | Grain boundary phase |
|---|---|---|---|
| Embodiment | ○ | ○ | ○ |
| First comparative ex. | ○ | — | — |
| Second comparative ex. | ○ | ○ | — |
| Example of related art | — | — | — |

Note:
○: yes, —: no

Evaluation of Properties

Figure 6:
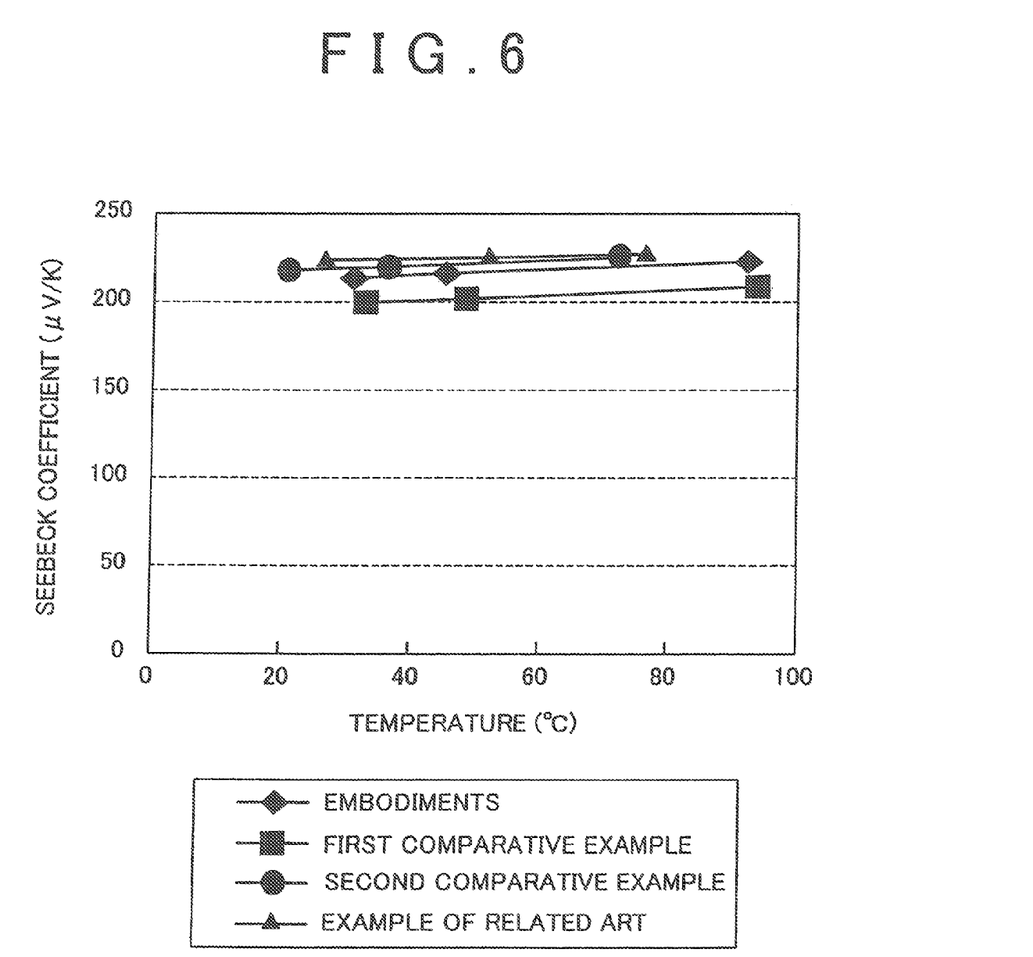
FIG. 6 is a graph comparing the Seebeck coefficient of the nanocomposite thermoelectric conversion material according to the embodiments of the invention with Comparative Examples 1 and 2, and an example of related art.
Figure 7:
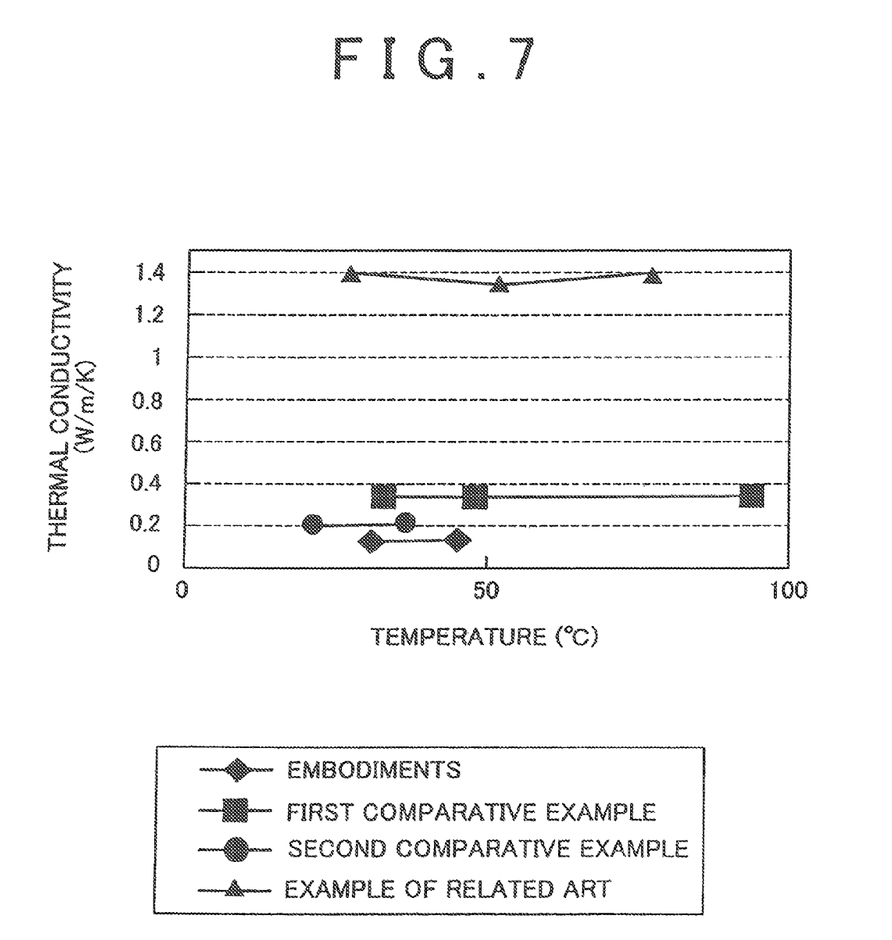
FIG. 7 is a graph comparing the thermal conductivity of the nanocomposite thermoelectric conversion material according to the embodiments of the invention with Comparative Examples 1 and 2, and an example of related art.
Figure 8:
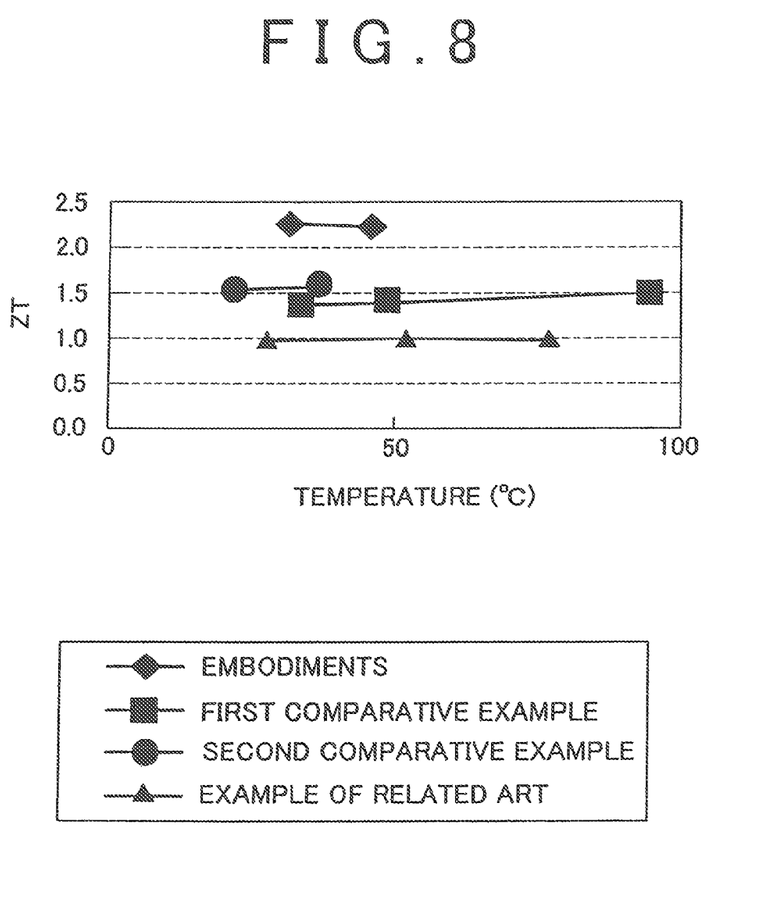
FIG. 8 is a graph comparing the dimensionless thermoelectric figure of merit (ZT) of the nanocomposite thermoelectric conversion material according to the embodiments of the invention with Comparative Examples 1 and 2, and an example of related art.

FIGS. 6, 7, and 8 show the results of the property evaluations of the nanocomposite thermoelectric conversion material prepared in Embodiment S of the invention. The properties of the first and second comparative examples and the example of related art are also listed in these figures.

As shown in FIG. 6, the Seebeck coefficient is roughly the same in all four materials, and it is clear that the composition, carrier concentration, and the like are also roughly the same.

As shown in FIG. 7, the thermal conductivity is lowered dramatically by the presence of the phonon-scattering particles in the embodiments, as well as in the first and second embodiments, in comparison with the example of related art. Particularly the thermal conductivity is lowered significantly in the embodiments when compared with those in the first and second comparative examples. This is attributed to the considerable increase in the thermal scattering interface due to the presence of the grain boundary phase itself and the two types of phonon-scattering particles in the grain boundary phase.

As shown in FIG. 8, the dimensionless thermoelectric figure of merit ZT is greatly increased by the considerable decrease in thermal conductivity. More specifically, the ZT value ranges from 0.9 to 1.0 in the example of related art with no phonon-scattering particles, from 1.4 to 1.5 in the first comparative example with only SiO$_2$ phonon-scattering particles but no grain boundary phase, and from 1.5 to 1.6 in the second comparative example with SiO$_2$ and Sb$_2$O$_3$ phonon-scattering particles but no grain boundary phase. In contrast, the ZT value greatly increases, ranging from 2.2 to 2.3, in the embodiments with both a grain boundary phase, and SiO$_2$ and Sb$_2$O$_3$ phonon-scattering particles. When the first comparative example is compared with the second comparative example, the properties of the latter are improved by the presence of the Sb$_2$O$_3$ second phonon-scattering particles. However, when the embodiments are compared with the second comparative example, in the former it is clear that the properties are greatly improved by the presence of the grain boundary phase, and the effect thereof is quite large. Therefore, although the data are not presented herein, it is clear that the presence of only the first phonon-scattering particles and the grain boundary phase has an effect, and that the effect is even greater when the second phonon-scattering particles are dispersed in the matrix.

The embodiments of the invention provides a nanocomposite thermoelectric conversion material and a process for producing the same with an even greater decease in thermal conductivity due to the effect of nanosized phonon-scattering particles and a greatly increased thermoelectric conversion performance by the crystal grain boundary in which phonon-scattering particles are dispersed to.

While the invention has been described with reference to example embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A process for producing a nanocomposite thermoelectric conversion material in which nanosized photon-scattering particles are dispersed in a matrix of the thermoelectric conversion material, the process comprising:
    a first step of preparing a starting solution by dissolving a salt of each constituent element of the thermoelectric conversion material and dispersing photon-scattering particles therein, wherein at least one type of constituent element in the thermoelectric conversion material is dissolved in the starting solution in an excess amount with relation to the solid solubility limit thereof at room temperature;

a second step of instilling a reducing agent into the starting solution to precipitate each of the constituent element of the thermoelectric conversion material onto surfaces of the photon-scattering particles to from a slurry;

a third step of preforming a hydrothermal treatment on the slurry and forming a composite in which the photon-scattering particles are dispersed in a matrix precursor having a high-melting point alloy phase with a relatively high melting point and a low-melting point alloy phase with a low melting point, wherein the excess amount of constituent element is precipitated in the matrix precursor and dispersed as second type photon-scattering particles;

a fourth step of sintering the composite and forming a sintered body in which the photon-scattering particles are dispersed in a polycrystalline matrix; and a fifth step of selectively melting on the low-melting point alloy phase in the crystal grain boundaries of the sintered body by performing a heat treatment on the sintered body, and incorporating nearby photon-scattering particles into the resulting low-melting point molten phase, and thereby forming a boundary phase as a composite in which the photon-scattering particles are dispersed in the low-melting point alloy phase, wherein the grain boundary phase is formed by dispersing the second type photon-scattering particles together with the photon-scattering particles.

2. The process for producing a nanocomposite thermoelectric conversion material according to claim 1 wherein the diameter of each of the crystal grains is less than or equal to 100 nm.

3. The process for producing a nanocomposite thermoelectric conversion material according to claim 2, wherein:
   the diameter of each of the photon-scattering particles dispersed within the crystal grains is 1 to 10 nm; and
   the diameter of each of the photon-scattering particles dispersed within the crystal grain boundary phase is 1 to 10 nm.

4. The process for producing a nanocomposite thermoelectric conversion material according to claim 1, wherein the photon-scattering particles dispersed within the crystal grains and the photon-scattering particles dispersed within the crystal grain boundary phase have the same diameter.

5. The process for producing a nanocomposite thermoelectric conversion material according to claim 1, wherein the photon-scattering particles are $SiO_2$ powder.

* * * * *